United States Patent [19]
Antone et al.

[11] Patent Number: 5,828,261
[45] Date of Patent: Oct. 27, 1998

[54] GATE DRIVE CIRCUIT THAT CONTROLS A POWER TRANSISTOR IN THREE STATES

[75] Inventors: James A. Antone, Edwards; Paul C. Gottshall, Washington, both of Ill.

[73] Assignee: Caterpillar Inc., Peoria, Ill.

[21] Appl. No.: 747,854

[22] Filed: Nov. 13, 1996

[51] Int. Cl.[6] .................................................. H03K 17/16
[52] U.S. Cl. .......................... 327/387; 327/427; 327/442
[58] Field of Search ................................. 327/108, 109, 327/110, 111, 112, 306, 317, 365, 376, 377, 387, 388, 389, 427, 434, 442

[56] References Cited

U.S. PATENT DOCUMENTS

| | | | |
|---|---|---|---|
| 4,052,623 | 10/1977 | Loberg | 307/251 |
| 4,461,966 | 7/1984 | Hebenstreit | 307/571 |
| 4,469,962 | 9/1984 | Snyder | 307/450 |
| 4,511,815 | 4/1985 | Wood | 307/584 |
| 4,603,269 | 7/1986 | Hochstein | 307/571 |
| 4,710,645 | 12/1987 | Doittau et al. | 307/115 |
| 4,849,683 | 7/1989 | Flolid | 323/284 |
| 4,890,009 | 12/1989 | Miyazaki et al. | 327/306 |
| 4,893,211 | 1/1990 | Bynum et al. | 361/18 |
| 4,970,420 | 11/1990 | Billings | 307/571 |
| 5,008,771 | 4/1991 | Palara | 361/103 |
| 5,010,261 | 4/1991 | Steigerwald | 307/571 |
| 5,051,613 | 9/1991 | Houser, Jr. et al. | 307/296.3 |
| 5,068,553 | 11/1991 | Love | 307/605 |
| 5,134,320 | 7/1992 | Perusse | 307/571 |
| 5,187,631 | 2/1993 | Baylac et al. | 327/365 |
| 5,195,007 | 3/1993 | Kikuchi et al. | 361/21 |
| 5,212,619 | 5/1993 | Baudelot et al. | 361/91 |
| 5,304,863 | 4/1994 | Cargille | 307/314 |
| 5,396,117 | 3/1995 | Housen et al. | 327/434 |
| 5,402,020 | 3/1995 | Yamakawa | 327/306 |
| 5,434,527 | 7/1995 | Antone | 327/391 |
| 5,446,406 | 8/1995 | Gantioler et al. | 327/434 |
| 5,463,521 | 10/1995 | Love | 361/58 |
| 5,546,043 | 8/1996 | Pollmeier | 327/427 |
| 5,602,505 | 2/1997 | Antone | 327/434 |

*Primary Examiner*—Toan Tran
*Assistant Examiner*—Jeffrey Zweizig
*Attorney, Agent, or Firm*—David M. Masterson

[57] ABSTRACT

In one aspect of the present invention a gate drive circuit is disclosed. The gate drive circuit includes a first voltage source, a power transistor, a first and second switching device, and a controller. The power transistor has a drain connected to the first voltage source and a source connected to a load. The first switching device is connected to the power transistor gate and biases the power transistor ON to transfer energy from the first voltage source to the load. The second switching device is connected to the power transistor gate and biases the power transistor OFF to block the transfer of energy from the first voltage source to the load. The controller is connected to the first and second switching device and controls the power transistor at a first state where the first switching device biases the power transistor ON, controls the power transistor at a second state where the second switching device biases the power transistor OFF and provides a signal path from the power transistor gate to ground, and controls the power transistor at a third state where the second switching device biases the power transistor OFF to protect the second switching device from short circuit voltages in response to the controller detecting a short circuit condition in the power transistor.

15 Claims, 1 Drawing Sheet

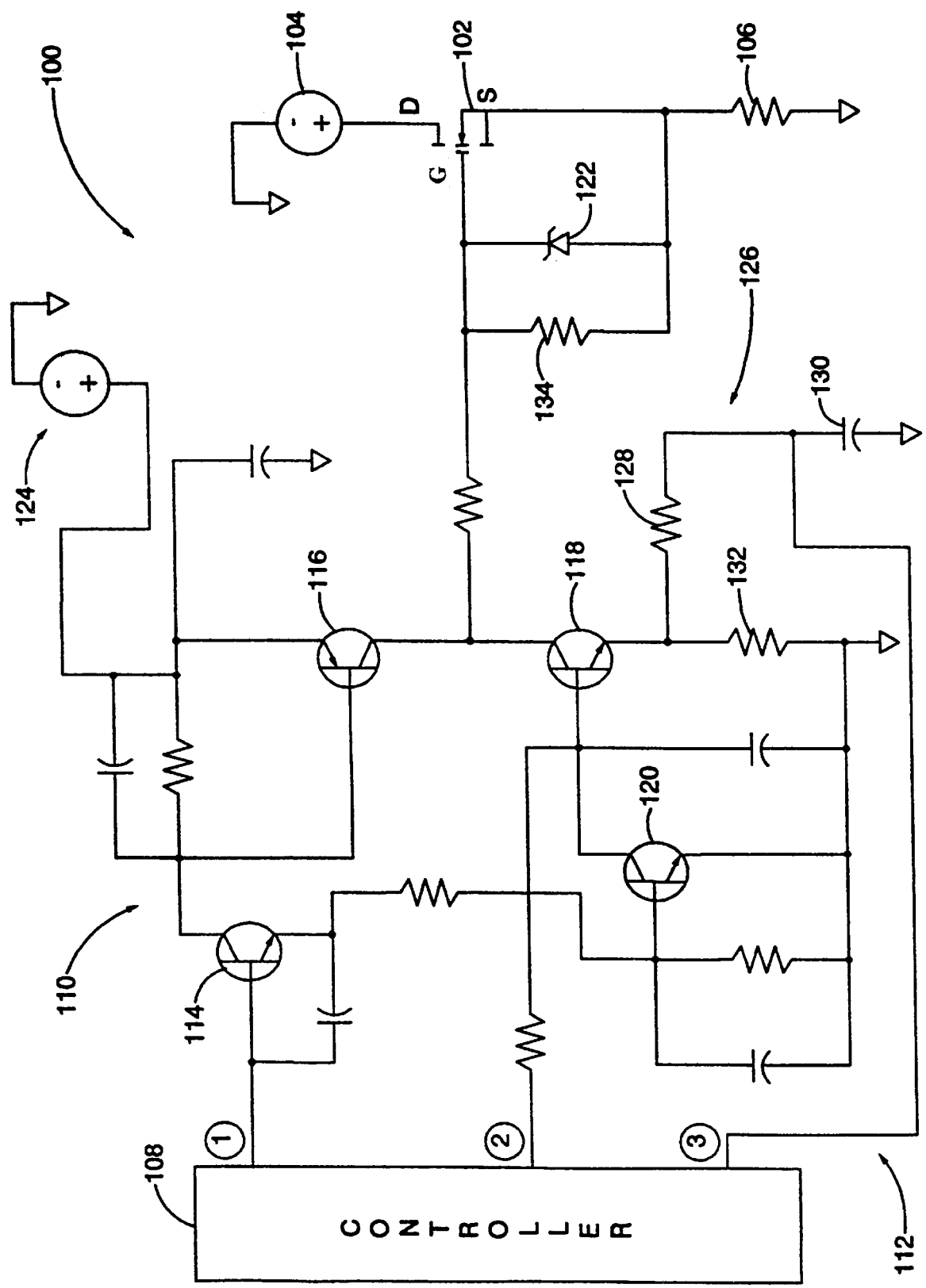

5,828,261

GATE DRIVE CIRCUIT THAT CONTROLS A POWER TRANSISTOR IN THREE STATES

DESCRIPTION

1. Technical Field

This invention relates generally to a gate drive circuit for a transistor and, more particularly, to an gate drive circuit for a transistor that controls voltage to a load.

2. Background Art

Power transistors are commonly used to control voltages and currents to a load. A power transistor may include an N-type MOSFET or an Insulated Gate Bipolar Transistor (IGBT). Because a power transistor passes voltage to a load, the MOSFET source may "float" over a voltage range from ground to the passed voltage. However, because the MOSFET gate must be biased with at least five volts greater than the source voltage, it becomes difficult to turn the power transistor ON.

To overcome the difficulty of turning ON the power transistor, a transformer has been used to control the power transistor bias. However a transformer is a costly circuit element. Moreover a transformer is bulky and radiates unwanted noise. Consequently such gate drive circuits are undesirable.

The present invention is directed to overcoming one or more of the problems as set forth above.

DISCLOSURE OF THE INVENTION

In one aspect of the present invention a gate drive circuit is disclosed. The gate drive circuit includes a first voltage source, a power transistor, a first and second switching device, and a controller. The power transistor has a drain connected to the first voltage source and a source connected to a load. The first switching device is connected to the power transistor gate and biases the power transistor ON to transfer energy from the first voltage source to the load. The second switching device is connected to the power transistor gate and biases the power transistor OFF to block the transfer of energy from the first voltage source to the load. The controller is connected to the first and second switching device and controls the power transistor at a first state where the first switching device biases the power transistor ON, controls the power transistor at a second state where the second switching device biases the power transistor OFF and provides a signal path from the power transistor gate to ground, and controls the power transistor at a third state where the second switching device biases the power transistor OFF to isolate the second switching device from short circuit voltages in response to the controller detecting a short circuit condition in the power transistor.

BRIEF DESCRIPTION OF THE DRAWINGS

For a better understanding of the present invention, reference may be made to the accompanying drawings in which:

The sole FIGURE shows a gate drive circuit associated with a preferred embodiment of the present invention.

BEST MODE FOR CARRYING OUT THE INVENTION

Referring now to the drawings, wherein a preferred embodiment of the present invention is shown, the sole FIGURE illustrates a gate drive circuit 100. The gate drive circuit 100 controls the state or bias of a power transistor 102. The power transistor 102 acts as a switch that regulates current from a first voltage source 104 to a load 106. The first voltage source 104 may include a vehicle battery, for example. The load may include a resistor, capacitor, or a solenoid that is part of a fuel injector for an engine, for example. As shown, the power transistor drain is connected to the first voltage source 104, and the power transistor source is connected to the load 106. The power transistor 102 may be of an N-type MOSFET or IGBT construction, for example.

A controller 108 is adapted to provide signals to control the state of the power transistor 102. The controller 108 may include a microprocessor, integrated circuit, or discrete circuit. Preferably, the controller 108 produces pulse width modulation (PWM) to control the state of the power transistor.

A first switching device 110 receives signals from the controller and responsively biases the power transistor ON to cause energy to pass from the first voltage source 104 through the power transistor 102 and to the load 106. A second switching device 112 is included which additionally receives signals from the controller and responsively biases the power transistor OFF. The first switching device 110 includes a first switching transistor 114 having a base connected to the controller 108 via line 1. The first switching transistor collector is connected to a base of a second switching transistor 116. The second switching transistor emitter is connected to a second voltage source 124. Preferably, the second voltage source 124 is approximately 12 volts greater than the first voltage source 104. The second switching transistor collector is connected to the power transistor gate via a gate resistor. Preferably, the first switching transistor 114 is of a small signal, NPN bipolar construction, while the second switching transistor 116 is of a small signal, bipolar PNP construction.

The second switching device 112 includes a third switching transistor 118 having a base connected to line 2 of the controller 108 via a resistor. The third switching transistor emitter is connected to ground via an emitter resistor 132 and also to line 3 of the controller 108. The third switching transistor collector is connected to the power transistor gate via a gate resister. The second switching device 112 additionally includes a fourth switching transistor 120 having a collector connected to the third switching transistor base. The fourth switching transistor base is connected to the first switching transistor emitter via a resistor. The fourth switching transistor emitter is connected to ground. Preferably, the third and forth switching transistors are of a small signal, NPN bipolar construction.

An RC filter 126, which includes resistor 128 and capacitor 130, is additionally provided.

A Zener Diode 122 is connected between the power transistor gate and source to provide a current path to ground in order to limit the power transistor gate-source voltage, which effectively limits the power transistor drain-source current.

Thus, while the present invention has been particularly shown and described with reference to the preferred embodiment above, it will be understood by those skilled in the art that various additional embodiments may be contemplated without departing from the spirit and scope of the present invention.

INDUSTRIAL APPLICABILITY

The operation of the present invention is now described. To bias the power transistor ON, the controller 108 produces "high" signals across lines 1 and line 2. The first switching transistor base receives the "high" signal and responsively energizes. This causes the second switching transistor 116 to be biased ON, which provides for the second voltage source 124 to energize the gate-source of the power transistor 102. Thus, as the power transistor gate-source voltage increases, the power transistor turns ON; thereby, passing energy from the first voltage source 104 to the load 106. Note that the power transistor gate remains approximately +V$_{ZENER}$ greater than the power transistor source, even though the source voltage floats from ground to voltage associated with the first voltage source. Moreover, the energized first switching transistor 114 biases the fourth switching transistor 120 ON via the fourth switching transistor base. Responsively, the third switching transistor base is pulled down via the energized fourth switching transistor 120. Thus, by biasing the first switching transistor 114 ON, the third switching transistor 118 is quickly biased OFF to inhibit any "crossover".

To bias the power transistor OFF, the controller 108 produces a "low" signal across line 1 and a "high" signal across line 2. The "low" signal on line 1 biases the first switching transistor 114 OFF, which de-energizes the second switching transistor 116 to block the flow of energy from the second voltage source 124 across the power transistor gate. Consequently, the fourth switching transistor 120 is biased OFF. The "high" state of line 2 pulls the base of the third switching transistor 118 "high" to allow a signal path to ground for the power transistor via the third switching transistor 118 to quickly bias the power transistor OFF.

Advantageously, the present invention provides for the power transistor to have a third or floating state. The third state isolates the third switching transistor 118 from short circuit voltages due to short circuit conditions from the first voltage source 104 to the load 106. This is accomplished by the controller 108 delivering "low" signals across lines 1 and 2. This causes the first switching transistor 114 to turn OFF, which biases the second and fourth switching transistors OFF. Meanwhile, the third switching transistor is turned OFF via line 2, which biases the third switching transistor OFF. Consequently, the power transistor 102 turns OFF by discharging to ground via resistor 134. This third state provides for the third switching transistor 118 to be protected in case of a short circuit from the first voltage source 104 to the load 106. The controller can detect such a short circuit condition, by reading the voltage across the emitter resister 132 via line 3.

For example, under normal operating conditions, the RC filter 126 attenuates transient voltages induced across the emitter resistor 132 due to the normal switching of the power transistor 102. However, during a short circuit condition, a high voltage—even after filtering—is induced across the emitter resistor 132. Advantageously, the controller 108 reads the high voltage across the emitter resistor 132 via line 3 and produces "low" signals across lines 2 and 3 to bias the switching transistors and the power transistor OFF to protect the third switching transistor 118.

Other aspects, objects and advantages of the present invention can be obtained from a study of the drawings, the disclosure and the appended claims.

We claim:

1. A gate drive circuit, comprising:
   a first voltage source;
   a power transistor having a drain connected to the first voltage source and a source connected to a load;
   a first switching device connected to the power transistor gate for biasing the power transistor ON to transfer energy from the first voltage source to the load;
   a second switching device connected to the power transistor gate for biasing the power transistor OFF to block the transfer of energy from the first voltage source to the load; and
   a controller connected to the first and second switching device for controlling the power transistor at a first state where the first switching device biases the power transistor ON, for controlling the power transistor at a second state where the second switching device biases the power transistor OFF and provides a signal path from the power transistor gate to ground, and for controlling the power transistor at a third state where the second switching device biases the power transistor OFF to isolate the second switching device from short circuit voltages in response to the controller detecting a short circuit condition from the first voltage source to the load.

2. A circuit, as set forth in claim 1, wherein the first switching device includes a first and a second switching transistor, the first switching transistor having a base connected to the controller and a collector connected to a base of a second switching transistor, the second switching transistor having an emitter connected to a second voltage source and a collector connected to the power transistor gate.

3. A circuit, as set forth in claim 2, wherein the second switching device includes a third and fourth switching transistor, the third switching transistor having a base connected to the controller, an emitter connected to ground and a collector connected to the power transistor gate, the fourth switching transistor having a collector connected to the third switching transistor base, a base connected to the first switching transistor emitter and an emitter connected to ground.

4. A circuit, as set forth in claim 3, wherein the first switching transistor is of a small signal, NPN bipolar construction, the second switching transistor is of a small signal, bipolar PNP construction, and the third and forth switching transistors are of a small signal, NPN bipolar construction.

5. A circuit, as set forth in claim 4, including a Zener Diode connected between the power transistor gate and source, the Zener Diode limiting the power transistor gate to source voltage and current.

6. A circuit, as set forth in claim 5, wherein the power transistor includes an N-channel MOSFET.

7. A gate drive circuit, comprising:
   a first voltage source;
   a second voltage source;
   a power transistor having a drain connected to the first voltage source and a source connected to a load;
   a controller;
   first and a second switching transistors, the first switching transistor having a base connected to the controller and a collector connected to a base of a second switching transistor, the second switching transistor having an emitter connected to a second voltage source and a collector connected to the power transistor gate; and
   third and fourth switching transistors, the third switching transistor having a base connected to the controller, an emitter connected to ground and a collector connected to the power transistor gate, the fourth switching transistor having a collector connected to the third switching transistor base, a base connected to the first switching transistor emitter and an emitter connected to ground.

8. A circuit, as set forth in claim 7, wherein the controller delivers a "high" signal to the first switching transistor base to energize the first switching transistor, the energized first switching transistor causing the energization of the second switching transistor to allow the second voltage source to energize the gate of the power transistor to bias the power transistor ON.

9. A circuit, as set forth in claim 8, wherein the controller delivers a "low" signal to the first switching transistor base to de-energize the first switching transistor to de-energize the second switching transistor to block the flow of energy from the second voltage source to the power transistor gate biasing the power transistor OFF in response to the first and fourth switching transistors being biased OFF.

10. A circuit, as set forth in claim 8, wherein the controller delivers a "high" signal to the third switching transistor base to energize the third switching transistor to allow a signal path to ground for the power transistor.

11. A circuit, as set forth in claim 9, wherein the controller detects a short circuit condition from the first voltage source to the load, delivers a "low" signal to the first switching transistor base de-energize the second and fourth switching transistors, and delivers a "low" signal to the third switching transistor base to de-energize the third switching transistor responsively biasing the power transistor to isolate the third switching transistor from the short circuit condition.

12. A circuit, as set forth in claim 11, wherein the first switching transistor is of a small signal, NPN bipolar construction, the second switching transistor is of a small signal, bipolar PNP construction, and the third and forth switching transistors are of a small signal, NPN bipolar construction.

13. A circuit, as set forth in claim 12, including a Zener Diode connected between the power transistor gate and source, the Zener Diode limiting the power transistor gate to source voltage and current.

14. A circuit, as set forth in claim 13, wherein the power transistor includes an N-channel MOSFET.

15. A circuit, as set forth in claim 14, including an RC filter connected between the third switching transistor emitter and the controller.

\* \* \* \* \*